United States Patent
Hwang et al.

(10) Patent No.: US 11,430,396 B2
(45) Date of Patent: Aug. 30, 2022

(54) DISPLAY PANEL AND DISPLAY DEVICE USING THE SAME

(71) Applicant: LG DISPLAY CO., LTD., Seoul (KR)

(72) Inventors: Seong Hwan Hwang, Gyeonggi-do (KR); Mun Chae Yoon, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/470,589

(22) Filed: Sep. 9, 2021

(65) Prior Publication Data

US 2022/0148519 A1   May 12, 2022

(30) Foreign Application Priority Data

Nov. 12, 2020   (KR) .......................... 10-2020-0150907

(51) Int. Cl.
*G09G 3/3291* (2016.01)
*G09G 3/3258* (2016.01)

(52) U.S. Cl.
CPC ......... *G09G 3/3291* (2013.01); *G09G 3/3258* (2013.01); *G09G 2300/0465* (2013.01); *G09G 2310/08* (2013.01)

(58) Field of Classification Search
CPC ..... G09G 2300/0426; G09G 2300/043; G09G 2300/0465; G09G 3/3233; G09G 3/3225; G09G 2320/0233; G09G 2320/0295
See application file for complete search history.

(56) References Cited

U.S. PATENT DOCUMENTS

| | | | |
|---|---|---|---|
| 2013/0050292 A1* | 2/2013 | Mizukoshi | G09G 3/3233 345/77 |
| 2018/0261663 A1* | 9/2018 | Li | H01L 21/77 |
| 2020/0074938 A1* | 3/2020 | Kim | G09G 3/3233 |

* cited by examiner

*Primary Examiner* — Dong Hui Liang
(74) *Attorney, Agent, or Firm* — Morgan, Lewis & Bockius LLP

(57) ABSTRACT

The present disclosure relates to a display panel and a display device using the same. The display panel includes: a plurality of data lines to which a data voltage is applied; a plurality of pixel driving voltage lines arranged parallel to the data lines, and to which a pixel driving voltage is applied; and a plurality of reference voltage lines overlapping the pixel driving voltage lines with an insulating layer disposed therebetween, arranged in parallel with the data lines, and to which a reference voltage lower than the pixel driving voltage is applied.

18 Claims, 10 Drawing Sheets

DISPLAY PANEL AND DISPLAY DEVICE USING THE SAME

CROSS-REFERENCE TO RELATED APPLICATION

This application claims priority to and the benefit of Korean Patent Application No. 10-2020-0150907, filed Nov. 12, 2020, the disclosure of which is incorporated herein by reference in its entirety.

BACKGROUND

1. Technical Field

The present disclosure relates to a display panel having an improved aperture ratio of pixels and a display device using the same.

2. Discussion of the Related Art

Electroluminescent display devices are roughly classified into inorganic light emitting display devices and organic light emitting display devices depending on the material of the emission layer. The organic light emitting display device of an active matrix type includes an organic light emitting diode (hereinafter, referred to as "OLED") that emits light by itself, and has an advantage in that the response speed is fast, and the luminous efficiency and luminance are good, and the viewing angle is wide. In the organic light emitting display device, an organic light emitting diode (OLED) is formed in each pixel. The organic light emitting display device has a fast response speed, is excellent in terms of luminous efficiency, luminance and viewing angle, and provides an excellent contrast ratio and color reproducibility since it can express black gradations in complete black.

The organic light emitting display device does not require a backlight unit, and may be implemented on a plastic substrate, a thin glass substrate, or a metal substrate, which is a flexible material. Therefore, the flexible display may be implemented as an organic light emitting display device.

In an organic light emitting diode display, to compensate for variations in driving characteristics between pixels, a sensing circuit for sensing element characteristics (threshold voltage, current mobility) in real time may be added to pixels. When a sensing circuit is added to the pixel circuit, the aperture ratio of the pixels may decrease due to the added elements and wires. To reduce the deterioration of the aperture ratio, the number of wires connected to the sensing circuit may be reduced, and a plurality of pixel circuits may be connected to the wires. However, this method may cause an increase in parasitic capacitance of data lines of the pixel array. When the parasitic capacitance of the data lines increases, the data voltage charge rate of the pixels decreases and the image quality may deteriorate.

SUMMARY

Accordingly, embodiments of the present disclosure are directed to a display panel and a display device using the same that substantially obviate one or more of the problems due to limitations and disadvantages of the related art.

An aspect of the present disclosure is to solve the aforementioned necessities and/or problems.

Another aspect of the present disclosure is to provide a display panel that can increase the aperture ratio of pixels and the charging rate of the pixels.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display panel comprises: a plurality of data lines to which a data voltage is applied; a plurality of pixel driving voltage lines arranged parallel to the data lines, and to which a pixel driving voltage is applied; a plurality of reference voltage lines overlapping the pixel driving voltage lines with an insulating layer disposed therebetween, arranged in parallel with the data lines, and to which a reference voltage lower than the pixel driving voltage is applied; and a plurality of gate lines crossing the data lines, the pixel driving voltage lines, and the reference voltage lines, and to which a gate signal is applied.

In another aspect, a display panel comprises: a first metal layer disposed on a substrate; a first insulating layer covering the first metal layer; a second metal layer disposed on the first insulating layer; a second insulating layer disposed on the first insulating layer to cover the second metal layer; a semiconductor layer disposed on the second insulating layer; a third insulating layer disposed on the second insulating layer to cover the semiconductor layer; and a third metal layer disposed on the third insulating layer.

The first metal layer includes a light shield layer disposed under a transistor, a bottom electrode of a capacitor, a plurality of data lines to which a data voltage is applied, and a plurality of pixel driving voltage lines arranged parallel to the data lines and to which a pixel driving voltage is applied.

The second metal layer includes a plurality of reference voltage lines overlapping the pixel driving voltage lines with the first insulating layer interposed therebetween.

The third metal layer includes a plurality of gate lines that cross the data lines, the pixel driving voltage lines, and the reference voltage lines and to which a gate signal is applied, and a gate electrode, a source electrode, and a drain electrode of the transistor.

In another aspect, a display device comprises: a display panel that includes a plurality of data lines, a plurality of pixel driving voltage lines arranged parallel to the data lines, a plurality of reference voltage lines overlapping the pixel driving voltage lines with an insulating layer interposed therebetween and arranged in parallel with the data lines, a plurality of gate lines crossing the data lines, the pixel driving voltage lines, and the reference voltage lines, and a plurality of subpixels; a data driver configured to supply a data voltage of pixel data to the data lines; a gate driver configured to supply a gate signal to the gate lines; and a power supply configured to supply a pixel driving voltage to the pixel driving voltage lines, and supply a reference voltage lower than the pixel driving voltage to the reference voltage lines.

In the present disclosure, the reference voltage line (REF line) to which the reference voltage REF is applied is disposed on the pixel driving voltage line (VDD line) to which the pixel driving voltage is applied so as to overlap the pixel driving voltage line (VDD line), and the reference voltage line (REF line) is connected to the subpixel without a branch. As a result, since there is no decrease in the aperture ratio due to the branch and the crossing of the data line and the reference voltage line (REF line) is minimized, the aperture ratio of the pixels and the charging rate of the pixels can be improved.

The REF line and the VDD line may be collectively patterned in a photolithography process using a half-tone mask to be formed on the same line.

Outside the pixel array, a plurality of REF lines are connected in a parallel structure, and a plurality of VDD lines are connected in a parallel structure. As a result, because the resistance of the REF lines and the VDD lines is reduced, the amount of IR drop of the VDD lines can be reduced and the linewidth of the VDD line can be decreased, so that the aperture ratio of the pixels can be further improved.

In the present disclosure, the first metal layer used as the VDD line may be set to be thicker than the second metal layer used as the REF line. In this case, as the resistance of the VDD line may be reduced and the linewidth of the VDD line may be reduced, the aperture ratio of the pixels may be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
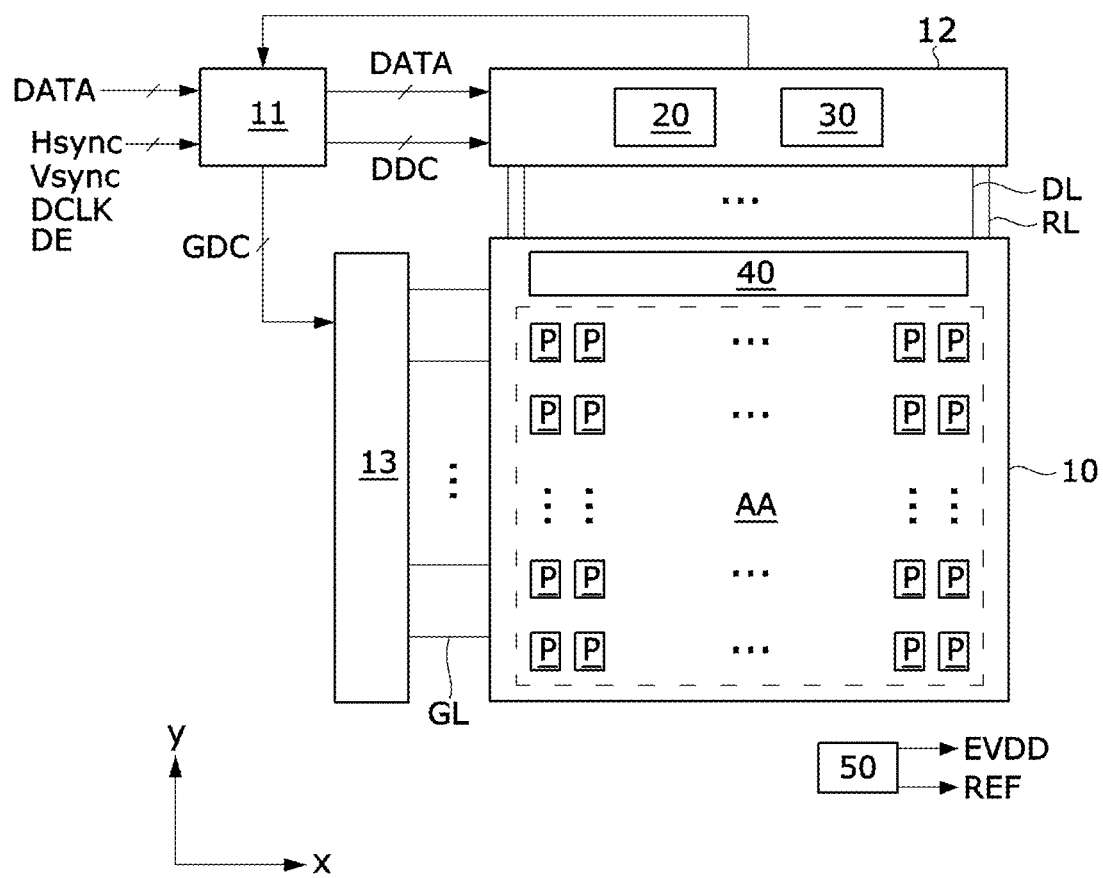
FIG. 1 is a block diagram schematically illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

In a display device of the present disclosure, a pixel circuit may include at least one of an n-channel transistor and a p-channel transistor. Transistors may be implemented as oxide thin film transistors (oxide TFTs) including an oxide semiconductor, low temperature polysilicon (LTPS) TFTs including low temperature polysilicon, or the like. Further, each of the transistors may be implemented as a p-channel TFT or an n-channel TFT. In embodiments, descriptions will be given based on an example in which the transistors of the pixel circuit are implemented as the p-channel TFTs, but the present disclosure is not limited thereto.

The driving element of a pixel circuit may be implemented with a transistor. The driving element should have uniform electrical characteristics among all pixels, but its electrical characteristics may differ between pixels due to process variations and variations in element characteristics and may change according to the lapse of the display driving time. To compensate for variations in electrical characteristics of the driving element, the display device may include an external compensation circuit. The external compensation circuit senses the threshold voltage and/or mobility of a driving element through a sensing switch element in each of the pixel circuits and a reference voltage line (hereinafter, referred to as "REF line") connected to the sensing switch element, and transmits it to an external compensation unit. The compensation unit compensates for changes in electrical characteristics of the driving element by modulating pixel data of the input image in consideration of the sensing result of each of the subpixels.

Hereinafter, a display device according to an embodiment of the present specification will be described with reference to the accompanying drawings. The same reference numbers throughout the specification mean substantially the same elements. In the following description, when it is determined that detailed descriptions of well-known functions or structures related to the present specification unnecessarily obscure the subject matter of the present specification, they will be omitted or shortened in brie.

Figure 2:
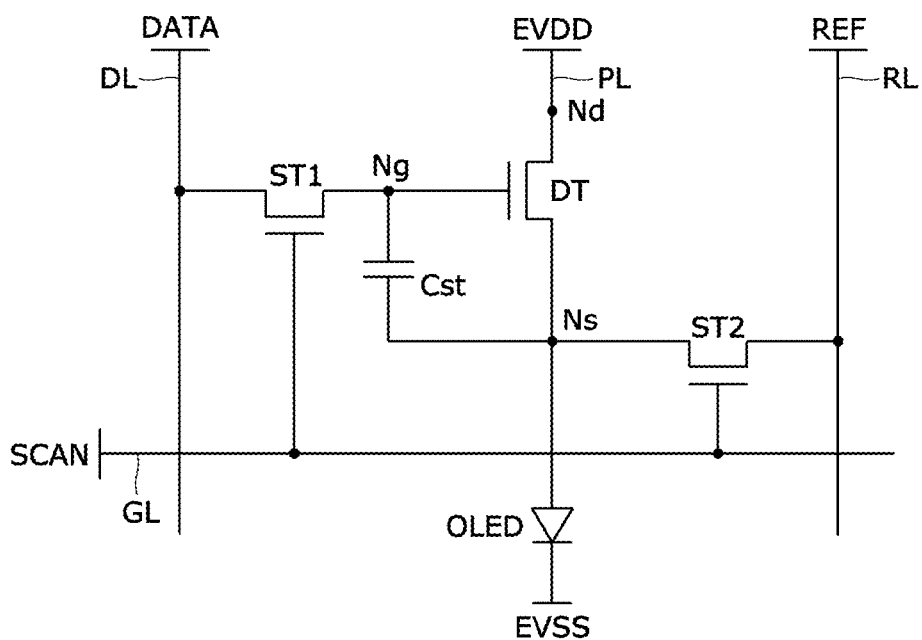
FIG. 2 is a circuit diagram showing an example of a pixel circuit.

With reference to FIG. 1 and FIG. 2, the display device of the present disclosure includes a display panel 10, and a display panel driver for writing pixel data to pixels of the display panel 10.

The display panel driver includes a source driver 12, a gate driver 13, and a timing controller 11.

The screen of the display panel 10 includes a pixel array AA on which an input image is displayed. In the pixel array AA, a plurality of data lines DL, a plurality of gate lines GL crossing the data lines DL, a plurality of REF lines RL parallel to the data lines DL, and a plurality of pixels P arranged in a matrix form are disposed.

The data lines DL and REF lines RL may be formed as long metal lines along a first direction (y-axis direction) on the display panel 10. The gate lines GL may be formed as long metal lines along a second direction (x-axis direction) crossing the first direction (y-axis direction) on the display panel 10.

Each of the pixels P may be divided into a red subpixel, a green subpixel, and a blue subpixel for color implementation. Each pixel may further include a white subpixel. Each of the subpixels may include a pixel circuit shown in FIG. 2.

Each of the subpixels is connected to one of the data lines DL to which the data voltage is supplied, to one of the REF lines RL to which the reference voltage REF is supplied, and to one of the gate lines GL. In addition, each of the subpixels is connected to the pixel driving voltage line (hereinafter, referred to as "VDD line") PL to which the pixel driving voltage EVDD is supplied, and is supplied with a low-potential power voltage EVSS through a low-potential power electrode (or, VSS electrode).

The display panel 10 may further include a switch unit 40. The switch unit 40 may include a demultiplexer (DEMUX) connected between channels through which a data voltage is output from the data driving unit 20 and the data lines DL. The demultiplexer may reduce the number of channels of the source driver 12 by distributing the data voltage output from one channel of the source driver 12 to two or more data lines DL in a time division manner.

The source driver 12 includes a data driving unit 20 that supplies a data voltage to the data lines DL of the display panel 10, and a sensing unit 30 that is connected to the pixel circuit of each of the subpixels and senses the driving characteristics of the pixel circuit in real time.

The data driving unit 20 includes a plurality of digital-to-analog converters (hereinafter, referred to as "DAC") disposed on the individual channels. In the display mode, the DAC of the data driving unit 20 converts pixel data DATA input from the timing controller 11 into a gamma compensation voltage for each gray level and outputs the data voltage Vdata. In the sensing mode, the data driving unit 20 outputs the data voltage Vdata for sensing under the control of the timing controller 11. The data voltage Vdata output from each of the channels of the data driving unit 20 may be directly applied to the data lines DL or may be applied to the data lines DL through the switch unit 40.

In the sensing mode, the sensing unit 30 samples the voltage on the REF line RL and converts it into digital data through an integrator and an analog-to-digital converter (hereinafter, referred to as "ADC") to output sensing data. The sensing data is transmitted to the compensation unit of the timing controller 11.

The gate driver 13 may be implemented as a gate-in-panel (GIP) circuit formed directly on the bezel region of the display panel 10 together with the thin film transistor (TFT) array of the pixel array. The gate driver 13 outputs a gate signal to the gate lines GL under the control of the timing controller 11. The gate driver 13 may shift the gate signal by using a shift register to sequentially supply the signals to the gate lines GL. The voltage of the gate signal swings between the gate-off voltage and the gate-on voltage. The gate driver 13 may be disposed on each of the left and right bezels of the display panel 10 to supply a gate signal to the gate lines GL in a double feeding scheme. In the double feeding scheme, the gate drivers 13 on both sides may be synchronized under the control of the timing controller 11, so that gate signals can be applied to both ends of one gate line at the same time. In another embodiment, the gate driver 13 may be disposed on one of the left and right bezels of the display panel 10 to supply a gate signal to the gate lines GL in a single feeding scheme.

The timing controller 11 modulates the pixel data of the input image based on the sensing data received from the sensing unit 30 and transmits it to the data driving unit 20 of the source driver 12, and controls the data driving unit 20 and the gate driver 13.

The timing controller 11 receives pixel data of an input image and a timing signal synchronized with the pixel data from the host system. The timing signal may include a vertical synchronization signal Vsync, a horizontal synchronization signal Hsync, a main clock CLK, and a data enable signal DE. One cycle of the vertical synchronization signal Vsync is one frame period. One cycle of the horizontal synchronization signal Hsync and the data enable signal DE is one horizontal period (1H). The pulse of the data enable signal DE is synchronized with one-line data to be written to the pixels of one pixel line. As the frame period and the horizontal period can be known by counting the data enable signal DE, the vertical synchronization signal Vsync and the horizontal synchronization signal Hsync may be omitted.

The timing controller 11 may multiply the input frame frequency (Hz) by i (i is a positive integer greater than 0) to generate control signals (DDC, GDC) of a frame frequency set to input frame frequency×i (Hz) for controlling the operation timing of the source driver 12, the gate driver 13, and the switch unit 40. The input frame frequency is 60 Hz in the National Television Standards Committee (NTSC) system and is 50 Hz in the Phase-Alternating Line (PAL) system. The timing controller 11 may lower the frame frequency to a frequency between 1 Hz and 30 Hz in order to lower the refresh rate of pixels in a low speed driving mode.

The voltage level of the gate timing control signal output from the timing controller 11 may be shifted through a level shifter omitted from the drawing. The gate timing signal may include a start pulse, a shift clock, or the like. The level shifter may convert a low level voltage of the gate timing control signal into a gate low voltage, and may convert a high level voltage of the gate timing control signal into a gate high voltage. The shift register of the gate driver 13 receives the gate timing control signal, generates a gate signal, and shifts the gate signal.

The timing controller 11 may control a sensing mode for sensing electrical characteristics of the driving element DT at each of the subpixels and updating a compensation value accordingly, and control a display mode for displaying pixel data of an input image at which the compensation value is reflected. The timing controller 11 may control the display panel driver (12, 13, 40) to separate the sensing mode and the display mode according to a predetermined sequence, but the present disclosure is not limited thereto. For example, the sensing mode may be performed during a vertical blank period of the display mode in which an input image is displayed on the pixels, may be performed during a power-on sequence period when application of power to the display device is started, or may be performed during a power-off sequence period before power is completely discharged after the display device is powered off. The vertical blank period is a period in which pixel data DATA of the input image is not written to the pixels. The vertical blank period is allocated between vertical active periods in which one frame of pixel data DATA is written. The power-on sequence period includes a transient period until the input image is displayed on the pixel array AA after application of power to the display device is started. The power-off sequence period includes a transient period until the power of the display device is completely cut off after data addressing of pixels is completed.

The compensation unit of the timing controller 11 may include a look-up table for compensation. This lookup table stores compensation values for compensating the threshold voltage Vth and the mobility μ of the driving element DT for each subpixel. To compensate for changes in electrical characteristics of the driving element DT at each of the subpixels, the compensation unit inputs the sensing data received from the ADC of the sensing unit 30 to the compensation lookup table, and modulates the pixel data of the input image by adding or multiplying the compensation value output from the compensation lookup table and the pixel data.

The host system may be one of a television (TV) system, a set-top box, a navigation system, a personal computer (PC), a home theater system, a mobile device, a wearable device, and a vehicle system.

The display device further includes a power supply 50. The power supply 50 may include a charge pump, a regulator, a buck converter, a boost converter, a programmable gamma IC, and the like. The power supply 50 adjusts the DC input voltage from the host system to generate power required for driving the display panel driver and the display panel 10. The power supply 50 may output a DC voltage, such as gamma reference voltage, gate low voltage, gate high voltage, pixel driving voltage EVDD, low-potential power voltage EVSS, or reference voltage REF. The pulse of the gate signal swings between the gate high voltage and the gate low voltage. The gamma reference voltage is applied to a voltage divider circuit of the data driving unit 20. The voltage divider circuit divides the gamma reference voltage to output a gamma compensation voltage for each gray level. The gamma compensation voltage for each gray level is supplied to the DAC of the data driving unit 20. The programmable gamma IC may change the voltage level of each gamma reference voltage according to a register setting.

FIG. 2 is a circuit diagram showing an example of a pixel circuit.

As shown in FIG. 2, the pixel circuit is connected to the data line DL to which the data voltage of the pixel data DATA is supplied, to the REF line RL to which the reference voltage REF is supplied, and to the gate line GL to which the gate signal SCAN is supplied. The reference voltage REF may be set to a DC voltage lower than the pixel driving voltage EVDD and lower than or equal to the low-potential power voltage EVSS.

The pixel circuit includes a light emitting element OLED, a driving element DT, a first switch element ST1, a second switch element ST2, and a storage capacitor Cst. Each of the driving element DT and the switch elements ST1 and ST2 may be implemented with a transistor.

The light emitting element OLED may be implemented with an OLED including an organic compound layer formed between the anode electrode and the cathode electrode. The organic compound layer may include, but not limited to, a hole injection layer (HIL), a hole transport layer (HTL), an emission layer (EML), an electron transport layer (ETL), and an electron injection layer (EIL). The light emitting element OLED is connected between a third node Ns connected to the source electrode of the driving element DT and the low-potential power voltage EVSS. The light emitting element OLED is driven by a current generated by the gate-source voltage Vgs of the driving element DT to emit light.

The driving element DT includes a gate electrode connected to a first node Ng, a drain electrode connected to a second node Nd, and a source electrode connected to a third node Ns. The source electrode of the driving element DT is connected to the anode electrode of the light emitting element OLED through the third node Ns. The driving element DT drives the light emitting element OLED by adjusting the amount of current applied to the light emitting element OLED according to the gate-source voltage Vgs. The pixel driving voltage EVDD may be applied to the drain electrode of the driving element DT.

The first switch element ST1 includes a gate electrode connected to the gate line GL, a drain electrode connected to the data line DL, and a source electrode connected to the first node Ng. The first switch element ST1 is turned on in response to a pulse of the gate signal SCAN from the gate line GL. When the first switch element ST1 is turned on, the data line DL to which the data voltage of the pixel data DATA is applied is connected to the first node Ng, and the data voltage is applied to the gate electrode of the driving element DT and the storage capacitor Cst.

The second switch element ST2 includes a gate electrode connected to the gate line GL, a drain electrode connected to the REF line RL, and a source electrode connected to the third node Ns. The second switch element ST2 is turned on in response to a pulse of the gate signal SCAN from the gate line GL to electrically connect the REF line RL and the third node Ns. When the second switch element ST2 is turned on, the reference voltage REF is applied to the third node Ns. When the second switch element ST2 is turned on in the sensing mode, the electrical characteristics of the driving element DT may be sensed by the current flowing through the third node Ns. The REF line RL is connected to the sensing unit 30 and the current flowing through the third node Ns is supplied to the sensing unit 30.

The storage capacitor Cst is connected between the first node Ng and the third node Ns and maintains the gate-source voltage Vgs of the driving element DT during the emission period of the pixel P. As the gate-source voltage Vgs increases, the driving current increases, and the amount of light emission of the pixel P increases accordingly. The luminance of the pixel P increases in proportion to the magnitude of the voltage applied to the first node Ng, that is, the data voltage Vdata.

Figure 3:
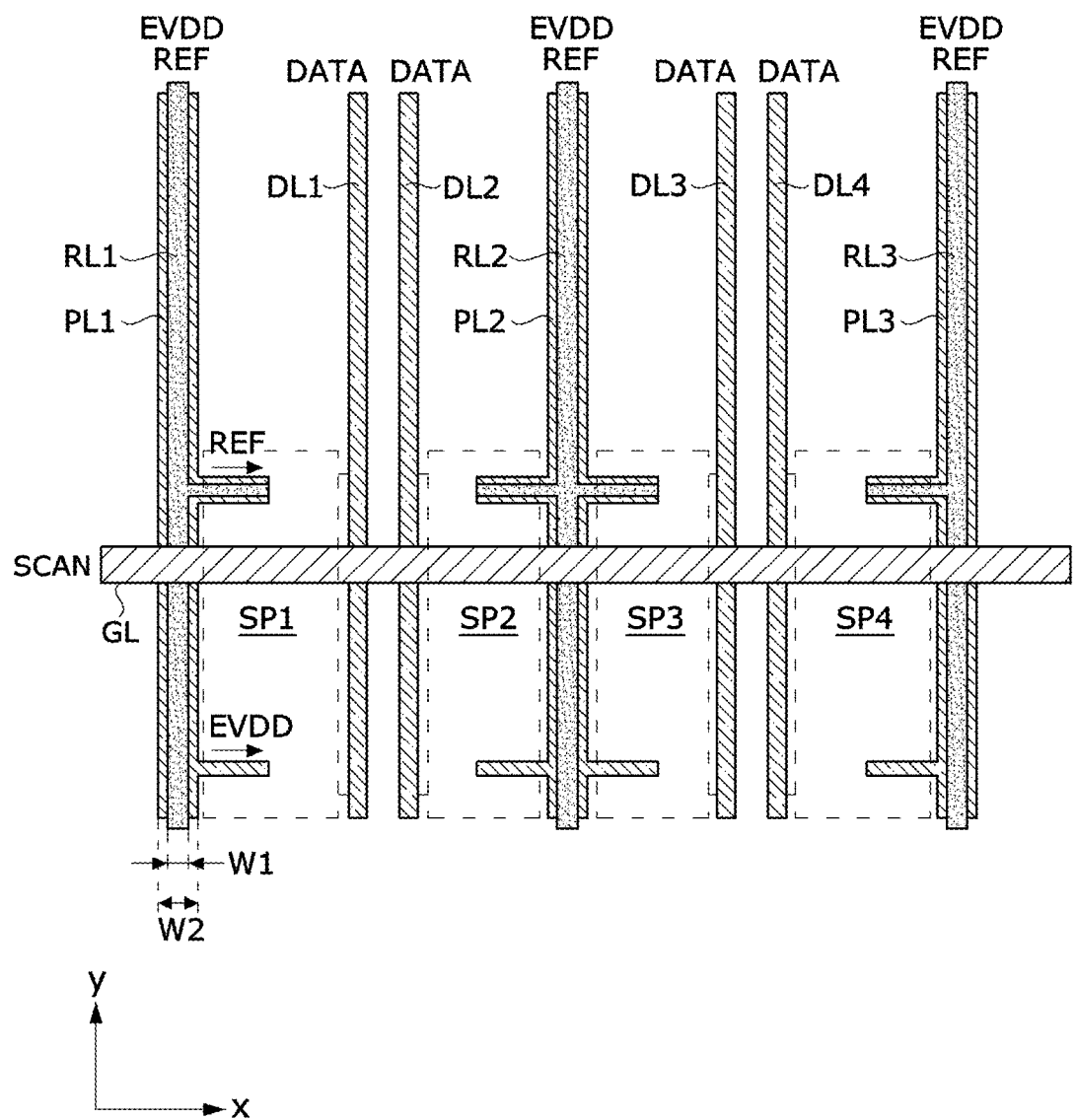
FIG. 3 is a plan view schematically illustrating wires of a pixel array.

FIG. 3 is a plan view schematically illustrating wires of the pixel array AA.

With reference to FIG. 3, the display panel 10 includes a plurality of data lines DL to which a data voltage is applied, a plurality of VDD lines PL that are arranged in parallel with the data lines DL and to which a pixel driving voltage EVDD is applied, and a plurality of REF lines RL that overlap the VDD lines PL and are arranged in parallel with the data lines DL and to which a reference voltage REF lower than the pixel driving voltage EVDD is applied. The display panel 10 further includes a plurality of gate lines GL that cross the data lines DL1 to DL4, the VDD lines PL, and the REF lines RL and to which the gate signal SCAN is applied.

Each of the subpixels SP1 to SP4 is connected to the data line DL1 to DL4, the gate line GL, and the power lines PL1 to PL3 and RL1 to RL3. The first to fourth subpixels SP1 to SP4 may be subpixels of any one-pixel line arranged side by side along a line direction parallel to the first direction x. The subpixels SP1 to SP4 arranged on one-pixel line are commonly connected to the gate line GL.

The first subpixel SP1, the second subpixel SP2, the third subpixel SP3, and the fourth subpixel SP4 may be, but not limited to, a red subpixel, a blue subpixel, a green subpixel, and a white subpixel, respectively. As the green and white subpixels have a relatively high light efficiency and luminance contribution rate, the size thereof may be smaller than that of the red and blue subpixels.

The REF lines RL1 to RL3 correspond to the VDD lines PL1 to PL3 in one-to-one manner. One of the REF lines RL1 to RL3 may overlap one of the VDD lines PL1 to PL3 along the length direction y of the VDD lines PL. The REF lines RL1 to RL3 may overlap the VDD lines PL1 to PL3 one by one along the length direction y of the VDD lines PL. These power lines PL and RL overlap with an insulating layer interposed therebetween. Hence, the aperture ratio of the subpixels can be improved.

The power lines PL1 to PL3 and RL1 to RL3 may be patterned on the display panel at the same time in a photolithography process (hereinafter, referred to as a "photo process") using a half-tone mask. Hence, both edges of the power lines PL1 to PL3 and RL1 to RL3 may substantially coincide although with a minute difference in linewidth (W1, W2).

A pair of first power lines PL1 and RL1 are disposed on the left side of the first subpixel SP1 to supply DC voltages EVDD and REF to the first subpixel SP1. Hence, the first VDD line PL1 and the first REF line RL1 are connected to the first subpixel SP1.

The first and second data lines DL1 and DL2 are disposed between the first and second subpixels SP1 and SP1 without the power lines PL1 to PL3 and RL1 to RL3. The second VDD line PL2 and the second REF line RL2 are disposed between the second and third subpixels SP2 and SP3 and are connected to the second and third subpixels SP2 and SP3. The pair of first power lines PL1 and RL1 are spaced apart from the pair of second power lines PL2 and RL2 with the two subpixels SP1 and SP2 interposed therebetween.

The third VDD line PL3 and the third REF line RL3 are disposed between the fourth subpixel SP4 and the fifth subpixel omitted from the drawing and are connected to the fourth subpixel SP4 and the fifth subpixel. Hence, a pair of overlapping power lines supply DC voltages EVDD and REF to two subpixels neighboring both sides of the power lines.

In the pixel array AA, the VDD lines PL1 to PL3, the REF lines RL1 to RL3, and the data lines DL1 to DL4 are wires whose length direction is parallel to the second direction y. The gate line GL is a wire whose length direction is parallel to the first direction x. Hence, in the pixel array AA, only the gate line GL is a wire that crosses the wires PL1 to PL3, RL1 to RL3, and DL1 to DL4 in the second direction.

The data lines DL1 to DL3 are connected to the subpixels SP1 to SP4 to supply a data voltage to the subpixels SP1 to SP4. As the number of signal lines or power lines crossing the data lines DL1 to DL4 increases, the parasitic capacitance of the data lines DL1 to DL4 increases. When the parasitic capacitance of the data lines DL1 to DL4 increases, as the charging amount of the data voltage of the subpixels SP1 to SP4 decreases, the charging rate of the subpixels SP1 to SP4 decreases. In the present disclosure, the number of wires crossing the data lines DL1 to DL4 is reduced to thereby decrease the parasitic capacitance of the data lines DL1 to DL4 and to improve the charging rate of the subpixels SP1 to SP4, so that the image quality can be improved.

Meanwhile, the REF lines R1 to R3 may be connected to a plurality of subpixels arranged in the first direction through a branch, but, due to the branch, the crossings of the data lines DL1 to DL3 and the REF lines R1 to R3 increase and the parasitic capacitance of the data lines DL1 to DL3 increases, so that the charging rate of the subpixels SP1 to SP4 decreases. In contrast, in the present disclosure, as the power lines PL1 to PL3 and RL1 to RL3 are disposed at the boundary between the neighboring subpixels SP1 to SP4 of the pixel array AA, the number of subpixels SP1 to SP4 connected to the power lines PL1 to PL3 and RL1 to RL3 is small.

Figure 4:
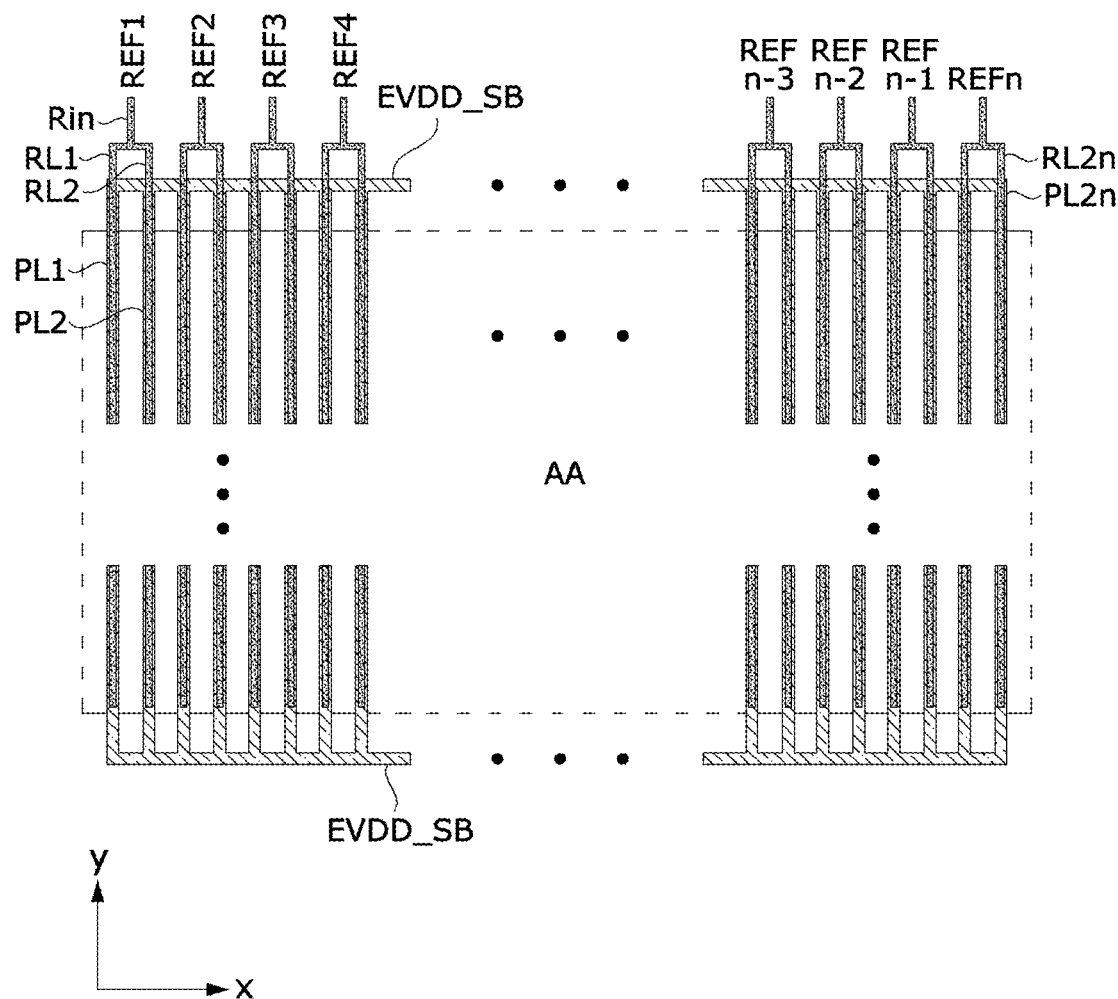
FIG. 4 is a plan view schematically showing an example in which power wires are connected in parallel.

The power lines PL1 to PL3 and RL1 to RL3 are connected in parallel as shown in FIG. 4, so that their resistance values may decrease. As a result, the voltage drop (IR drop) of the VDD lines PL1 to PL4 in the entire pixel array AA is reduced, so that the deviation of the pixel driving voltage EVDD applied to the subpixels SP1 to SP4 can be reduced. Hence, as the linewidth W2 of the VDD lines PL1 to PL3 can be reduced within an allowable range, the aperture ratio of the subpixels SP1 to SP4 may be further improved.

The linewidth W1 of the REF lines RL1 to RL3 is preferably set to be less than or equal to the linewidth W2 of the VDD lines PL1 to PL3. When the linewidth W1 of the REF lines RL1 to RPL3 increases, the REF lines RL1 to RL3 and the gate line GL may be shorted to each other FIG. 4 is a plan view schematically showing an example in which power wires PL1 to PL2$n$ and RL1 to RL2$n$ are connected in parallel.

With reference to FIG. 4, the VDD lines PL1 to PL2$n$ are connected to each other through EVDD shorting bars EVDD_SB at the top and bottom of the pixel array AA to be implemented as parallel wiring, so that the resistance values thereof may be reduced.

Two or more REF lines RL1 to RL2$n$ may be connected at the top or bottom of the pixel array AA to be implemented as parallel wiring, so that the resistance values thereof may be reduced. For example, the neighboring first and second REF lines RL1 and RL2 may be connected to one first voltage lead-in portion Rin. The $2n$-$1^{th}$ and $2n^{th}$ REF lines RL2$n$-1 and RL2$n$ may be connected to one $n^{th}$ voltage lead-in portion Rin. Here, n is a natural number. In the example of FIG. 4, every two of the REF lines RL1 to RL2$n$ are connected to one voltage lead-in portion Rin, but the present disclosure is not limited thereto. Every N of the REF lines RL1 to RL2$n$ (N is a natural number between 2 and 10 inclusive) may be connected to one voltage lead-in portion Rin. The first and second VDD lines PL1 and PL2 may be connected to each other through EVDD shorting bars EVDD_SB disposed at upper and lower ends of the display panel 10.

The voltage lead-in portions Rin of the REF lines RL1 to RL2n and the EVDD shorting bars EVDD_SB are disposed on the display panel 10 outside the pixel array AA. Hence, there is no decrease in the aperture ratio of the subpixels SP1 to SP4 because of the parallel connection structure of the power lines PL1 to PL2n and RL1 to RL2n.

Because the resistance values of the power lines PL1 to PL2n and RL1 to RL2n are reduced, the linewidths W1 and W2 of the power lines PL1 to PL2n and RL1 to RL2n may be reduced within an allowable range, so that the aperture ratio of the subpixels SP1 to SP4 is improved.

Figure 5:
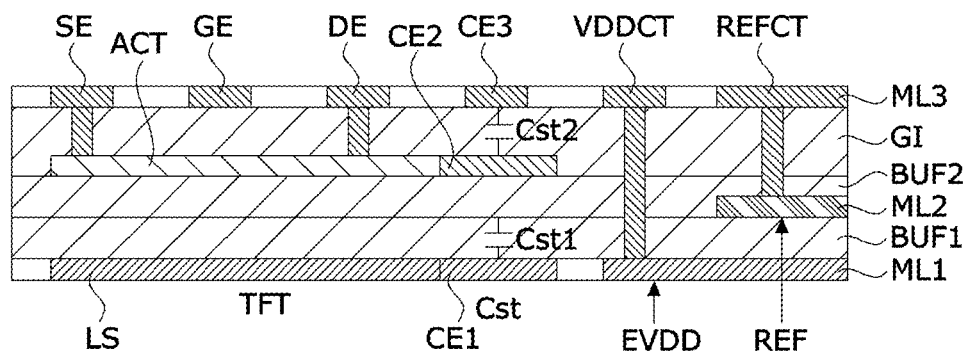
FIG. 5 is a cross-sectional view schematically showing a cross-sectional structure of a pixel circuit in a display device according to an embodiment of the present disclosure.

FIG. 5 is a cross-sectional view schematically showing a cross-sectional structure of the pixel circuit in a display device according to an embodiment of the present disclosure.

With reference to FIG. 5, the cross-sectional structure of the pixel circuit includes a first metal layer ML1 disposed on the substrate of the display panel, a first buffer layer BUF1 covering the first metal layer ML1, a second metal layer ML2 disposed on the first buffer layer BUF1, a second buffer layer BUF2 disposed on the first buffer layer BUF1 to cover the second metal layer ML2, a semiconductor layer ACT disposed on the second buffer layer BUF2, a gate insulating layer GI disposed on the second buffer layer BUF2 to cover the semiconductor layer ACT, and a third metal layer ML3 disposed on the gate insulating layer GI.

The buffer layers BUF1 and BUF2 and the gate insulating layer GI are insulating layers made of an insulating material, for example, an inorganic insulating material such as $SiO_2$ or SiNx.

The gate electrode GE, the source electrode SE, and the drain electrode DE of the transistor TFT disposed in the pixel circuit may be formed of metal patterns separated through patterning from the third metal layer ML3 disposed on the gate insulating layer GI. Here, the transistor TFT may be the driving element DT, the first switch element ST1, or the second switch element ST2 shown in FIG. 2. The third metal layer ML3 further includes a gate line GL. Hence, the electrodes GE, SE and DE of all transistors and the gate line GL constituting the pixel circuit are substantially disposed on the same plane.

The third metal layer ML3 may further include a first contact electrode (hereinafter, referred to as "VDD contact electrode") VDDCT connected to the VDD line PL, and a second contact electrode (hereinafter, referred to as "REF contact electrode") REFCT connected to the REF line RL. Also, the third metal layer ML3 may further include the top electrode CE3 of the storage capacitor Cst.

The first metal layer ML includes a data line DL, a light shield layer LS of the transistor TFT, the bottom electrode CE1 of the capacitor Cst, and a VDD line PL. The light shield layer LS of the transistor TFT blocks external light so that light is not irradiated to the semiconductor channel layer of the transistor TFT, preventing leakage current and deterioration of the transistor TFT. The second metal layer ML2 includes a REF line RL overlapping the VDD line PL with the first buffer layer BUF1 interposed therebetween.

The semiconductor layer ACT includes the semiconductor channel of the transistor TFT and the intermediate electrode CE2 of the storage capacitor Cst. The semiconductor layer ACT may be metallized at at least some portions, for example, a portion connecting the metal layers, and a portion connecting the elements of the pixel circuit. The semiconductor layer ACT is not metalized at the semiconductor channel defined under the gate electrode GE of the transistor TFT.

In the case of indium gallium zinc oxide (IGZO) being a representative oxide semiconductor, the conduction characteristics vary depending on the oxygen content. When the oxygen content decreases, the conductivity of the oxide semiconductor (IGZO) increases and it is metalized. As a method of reducing the oxygen content of the oxide semiconductor (IGZO), plasma treatment may be used. For example, when the oxide semiconductor is exposed to plasma (metallization process), oxygen contained in the oxide semiconductor is removed and the resistance of the oxide semiconductor (IGZO) is lowered, so that the oxide semiconductor may be metalized. Plasma treatment is a method of generating plasma discharge in helium (He), hydrogen ($H_2$), or argon (Ar) gas.

A metal layer may be formed in part on the semiconductor layer ACT. The metal layer formed on the semiconductor layer ACT and the gate electrode GE of the transistor act as a mask in the metallization process of the semiconductor layer ACT, so that the semiconductor layer ACT under this metal is not metalized.

The semiconductor layer ACT may further include the intermediate electrode CE2 of the storage capacitor Cst made of a metalized semiconductor layer. The intermediate electrode CE2 may be formed of a separate metal layer formed on the semiconductor layer ACT.

The storage capacitor Cst may include a first capacitor Cst1 between the bottom electrode CE1 and the intermediate electrode CE2, and a second capacitor Cst2 between the intermediate electrode CE2 and the top electrode CE3. As such, the storage capacitor Cst may have an increased capacity by using the two capacitors Cst1 and Cst2. The size of the electrode of the storage capacitor Cst may be reduced without reducing the capacity required by the storage capacitor Cst. Hence, as the size of the storage capacitor Cst is reduced, the aperture ratio of the pixels P can be improved.

Figure 6:
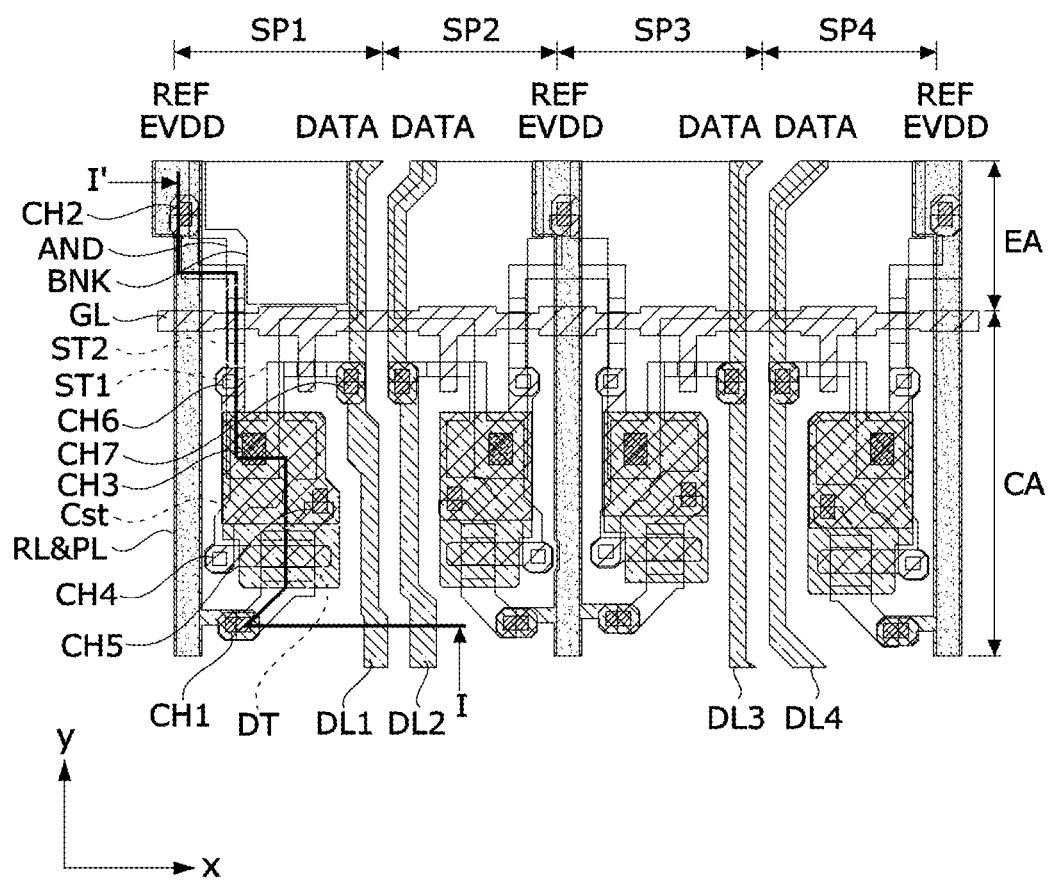
FIG. 6 is a plan view showing in detail a part of a pixel array in a display panel according to an embodiment of the present disclosure.

FIG. 6 is a plan view showing in detail a part of the pixel array in a display panel according to an embodiment of the present disclosure.

With reference to FIG. 6, each of the subpixels SP1 to SP4 includes an emission section EA and a circuit section CA.

The emission section EA of the subpixels SP1 and SP4 includes a light emitting element OLED. A color filter may be disposed in the emission section EA. The circuit section CA includes the driving element DT for driving the light emitting element OLED, the first switch element ST1, the second switch element ST2, the storage capacitor Cst, and the like. The light emitting element OLED may be driven by a pixel circuit implemented in the circuit section CA to emit light.

The emission section EA of each of the subpixels SP1 to SP4 is defined by a pixel defining layer BNK that is formed on the anode electrode AND of the light emitting element OLED to expose the anode electrode AND.

Each of the first to fourth data lines DL1 to DL4 is connected to the first switch element ST1 of the respective corresponding subpixels SP1 to SP4 to supply the data voltage of the pixel data to the pixel circuit of the respective subpixels SP1 to SP4. The gate line GL is connected to the gate electrodes of the first and second switch elements ST1 and ST2.

The pixel driving voltage EVDD is applied to the pixel circuit of each of the subpixels SP1 to SP4 through the VDD line PL. The reference voltage REF is applied to the pixel circuit of each of the subpixels SP1 to SP4 through the REF line RL. The REF line RL does not include a branch crossing the data lines DL1 to DL2. Hence, as there is no portion where the data lines DL1 to DL4 and the REF line RL overlap and cross in the pixel array AA, the parasitic capacity of the data lines DL to DL4 is reduced, and the aperture ratio of the subpixels SP1 to SP4 can be further improved since there is no decrease in the aperture ratio due to a branch.

Figure 7:
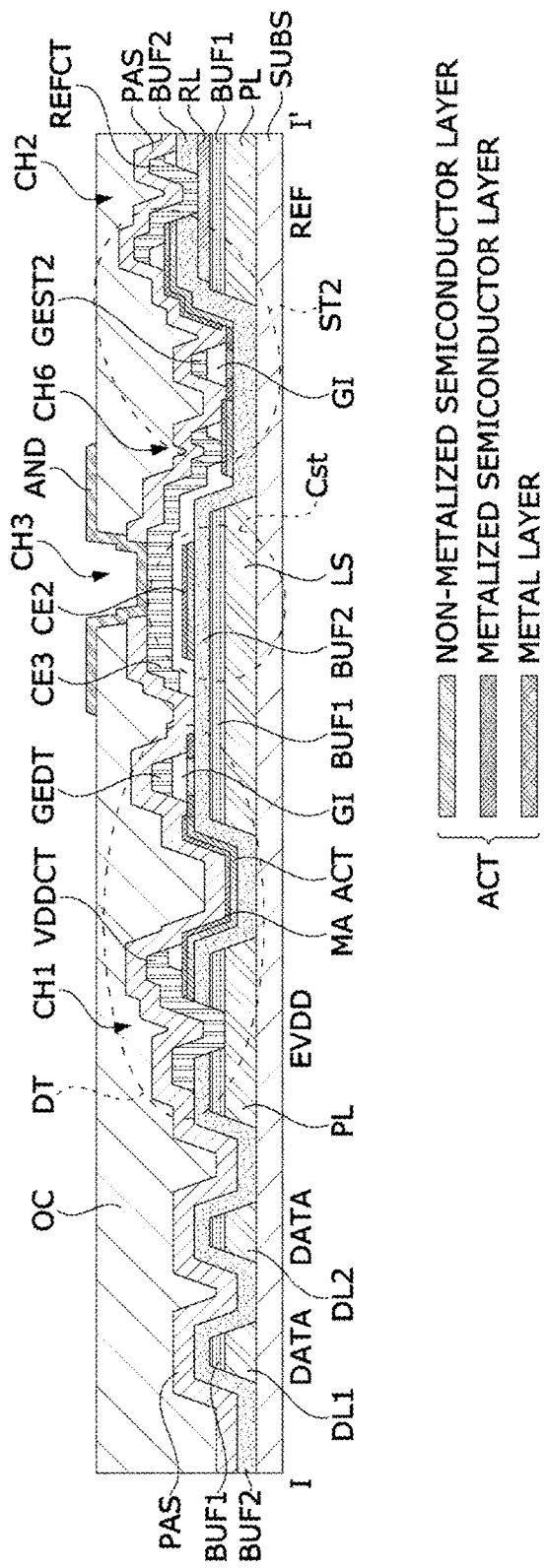
FIG. 7 is a cross-sectional view illustrating a cross-sectional structure of a pixel circuit taken along line I-I' in FIG. 6.

FIG. 7 is a cross-sectional view illustrating a cross-sectional structure of the pixel circuit taken along line I-I' in FIG. 6. In FIG. 6, a part of the emission section EA of the subpixels SP1 to SP4 is omitted.

With reference to FIGS. 6 and 7, the first metal layer is disposed on the substrate SUBS of the display panel 10. The first buffer layer BUF1 is disposed on the substrate SUBS to cover the first metal layer. The second metal layer is disposed on the first buffer layer BUF1, and the second buffer layer BUF2 is disposed on the first buffer layer BUF1 to cover the second metal layer.

The first and second buffer layers BUF1 and BUF2 may be formed of, but not limited to, an inorganic insulating material, for example, an oxide film such as SiO2.

The first metal layer and the second metal layer may be collectively patterned in a photo process using a half-tone mask. The first and second metal layers may be formed of, but not limited to, copper/molitanium (Cu/MoTi) in which copper (Cu) and molitanium (MoTi) are stacked.

The first metal layer includes the data lines DL1 and DL2, the VDD line PL, the light shield layer LS, and the bottom electrode CE1 of the storage capacitor Cst. The light shield layer LS and the bottom electrode CE1 of the storage capacitor Cst may be an integrated metal pattern. The light shield layer LS is disposed on the driving element DT and the storage capacitor Cst to overlap the gate electrode GEDT and the semiconductor channel of the driving element DT.

The second metal layer includes the REF line RL to which the reference voltage REF is applied. As the second and second metal layers in a stacked state are collectively etched using a half-tone mask, the REF line RL overlaps the VDD line PL.

The first metal layer may be formed thicker than the second metal layer. In this case, as the resistance of the VDD line PL is lowered, the amount of IR drop of the VDD line PL is reduced, so that the linewidth W of the VDD line PL may be reduced. As the channel resistance of the second switch element ST2 is greater than the resistance of the REF line REF in the sensing mode, the resistance of the REF line REF does not significantly affect the sensing performance in the sensing mode. For this reason, the second metal layer may be formed to be thinner than the first metal layer within a range allowed for the sensing performance.

As shown in FIG. 7, in a region where the second metal layer is disposed on the first metal layer and the first metal layer and the second metal layer overlap, the first buffer layer BUF1 may be disposed between the first metal layer and the second metal layer. For example, the first buffer layer BUF1 may be disposed between the VDD line PL and the REF line RL for insulation.

In contrast, in a region where the second metal layer does not overlap the first metal layer, the first buffer layer BUF1 and the second buffer layer BUF2 may be stacked and formed on the first metal layer. For example, in a region where the REF line RL is not formed on the data lines DL1 and DL2, the first and second buffer layers BUF1 and BUF2 may be stacked on the data lines DL1 and DL2. In this case, as the parasitic capacitance is reduced in a portion where the data lines DL1 and DL2 and the gate line GL overlap, the charging rate of the pixels PL may be further improved.

Meanwhile, in a region where the second metal layer and the first metal layer do not overlap, the first buffer layer BUF1 may be omitted in order to easily form a contact hole for exposing the top surface of the first metal layer. For example, when the first buffer layer BUF1 under the second buffer layer BUF2 is removed at the contact holes such as the first contact hole CH1 and the seventh contact hole CH7, as the thickness of the insulating layer is thin, there is no need to enlarge the contact hole. Hence, it is possible to easily form the contact hole. Therefore, the first and second buffer layers BUF1 and BUF2 may be stacked or the first buffer layer BUF1 may be omitted as necessary on the pattern of the first metal layer not overlapping the second metal layer.

The semiconductor layer ACT is disposed on the second buffer layer BUF2. The semiconductor layer ACT includes semiconductor channels of the transistors DT, ST1 and ST2, that is, an active layer. Further, the semiconductor layer ACT includes the intermediate electrode CE2 of the storage capacitor Cst.

The semiconductor layer ACT includes a metalized part at a portion connecting the electrodes of the transistors DT, ST1 and ST2 and at the intermediate electrode CE2 of the storage capacitor Cst. The gate electrodes of the transistors DT, ST1 and ST2 mask the semiconductor layer thereunder in the metallization process of the semiconductor layer. Hence, the semiconductor channels of the transistors DT, ST1 and ST2 are defined by the gate electrodes. In FIG. 7, reference symbol "GEDT" indicates the gate electrode of the driving element DT, and reference symbol "GEST2" indicates the gate electrode of the second switch element ST2.

A metal layer MA may be formed on the semiconductor layer ACT. The semiconductor layer ACT and the metal layer MA may be formed of, but not limited to, IGZO and MoTi, respectively. The metal layer MA directly contacts the semiconductor layer ACT at a portion where the semiconductor layer ACT needs to be metalized. The semiconductor layer ACT and the metal layer MA may be collectively patterned in a photo process using a half-tone mask. Hence, the pattern of the metal layer MA overlaps the semiconductor layer ACT and is disposed along the pattern of the semiconductor layer ACT.

The metal layer MA does not cover the metalized semiconductor layer so that the parasitic capacitance does not increase at portions connecting the electrodes of the transistors DT, ST1 and ST2.

The gate insulating layer GI covers the semiconductor layer ACT. The gate insulating layer GI may be, but not limited to, an oxide film such as SiO2. The gate insulating layer GI may be patterned to remain under the patterns of the third metal layer in a photo process. Hence, the gate insulating layer GI is disposed between the electrodes and the semiconductor channels of the transistors DT, ST1 and ST2.

The third metal layer is disposed on the gate insulating layer GI and patterned in a photo process. The third metal layer includes the electrodes of the transistors DT, ST1 and ST2, the VDD contact electrode VDDCT, the REF contact electrode REFCT, and the top electrode CE3 of the storage capacitor Cst.

The gate electrode GEDT of the driving element DT made of the third metal layer is connected to the intermediate electrode CE2 of the storage capacitor Cst through the fourth contact hole CH4 as shown in FIG. 6. The fourth contact hole CH4 penetrates the gate insulating layer GI to expose the metalized semiconductor layer ACT or the metal layer MA on the semiconductor layer ACT, which serves as the intermediate electrode CE2.

The top electrode CE3 of the storage capacitor Cst is connected to the source electrode of the driving element DT through the fifth contact hole CH5. The fifth contact hole CH5 penetrates the gate insulating layer GI and the buffer layers BUF1 and BUF2 to expose the top electrode CE3 of the storage capacitor Cst.

The VDD contact electrode VDDCT is connected to the VDD line PL through the first contact hole CH1 penetrating the first and second buffer layers BUF1 and BUF2. The VDD contact electrode VDDCT is connected to the drain electrode of the driving element DT through the metalized semiconductor layer ACT or the metal layer MA formed on the semiconductor layer ACT.

The REF contact electrode REFCT is connected to the REF line RL through the second contact hole CH2 penetrating the first and second buffer layers BUF1 and BUF2. The REF contact electrode REFCT is connected to the drain electrode of the second switch element ST2 through the metalized semiconductor layer ACT or the metal layer MA formed on the semiconductor layer ACT.

Hence, the VDD contact electrode VDDCT is connected to the VDD line PL made of the first metal layer through the first contact hole CH1. The REF contact electrode REFCT is connected to the REF line RL made of the second metal layer through the second contact hole CH2. The passivation layer PAS is an insulating layer disposed on the second buffer layer BUF2 and the semiconductor layer ACT to cover the third metal layer and the semiconductor layer ACT. The passivation layer PAS may be formed of, but not limited to, an inorganic insulating material, for example, an oxide film such as $SiO_2$. A planarization layer OC is disposed on the passivation layer PAS. The planarization layer OC covers the circuit section CA and flattens the surface. The planarization layer OC may be formed of, but not limited to, an organic material such as polyimide, benzocyclobutene series resin, or acrylate.

Components of the emission section EA are disposed on the planarization layer OC. The anode electrode AND of the light emitting element OLED is connected to the source electrode of the driving element DT, the top electrode CE3 of the second storage capacitor Cst, and the source electrode of the first switch element ST1 through the third contact hole CH3 penetrating the passivation layer PAS and the planarization layer OC. The sixth contact hole CH6 penetrates the buffer layers BUF1 and BUF2 to expose the source electrode of the second switch element ST2.

The drain electrode of the first switch element ST1 is connected to the data lines DL1 to DL4 through the seventh contact hole CH7. The seventh contact hole CH7 penetrates the first and second buffer layers BUF1 and BUF2 to expose the data lines DL1 to DL4.

When viewed in the pixel emission direction, the display panel 10 may be implemented in a bottom emission method. In this case, the anode electrode AND may be formed on the planarization layer OC as a transparent electrode. For example, the anode electrode AND may be made of a transparent electrode material such as indium tin oxide (ITO), indium zinc oxide (IZO), or zinc oxide (ZnO).

The pixel defining layer BNK defining a light emitting region of each of the subpixels SP1 to SP4 is disposed on the planarization layer OC so as to cover the anode electrode AND.

The pixel defining layer BNK is formed on the organic compound layer and the cathode electrode omitted in FIGS. 6 and 7. The organic compound layer may include a hole injection layer (HIL), a hole transport layer (HTL), an emission layer (EML), an electron transport layer (ETL), and an electron injection layer (EIL). The organic compound layer is separated between neighboring subpixels SP1 to SP4 by the pixel defining layer BNK, so that a light emitting region is defined for each subpixel. The cathode electrode of the light emitting elements is disposed on the organic compound layer EL. The cathode electrode may be formed over the entire pixel array AA and may be commonly connected between the subpixels SP1 to SP4. In the bottom emission method, the cathode electrode may be implemented as a metal electrode having a high light reflectance. For example, the cathode electrode may be made of magnesium (Mg), calcium (Ca), aluminum (Al), silver (Ag), or an alloy thereof having a low work function.

Figure 8:
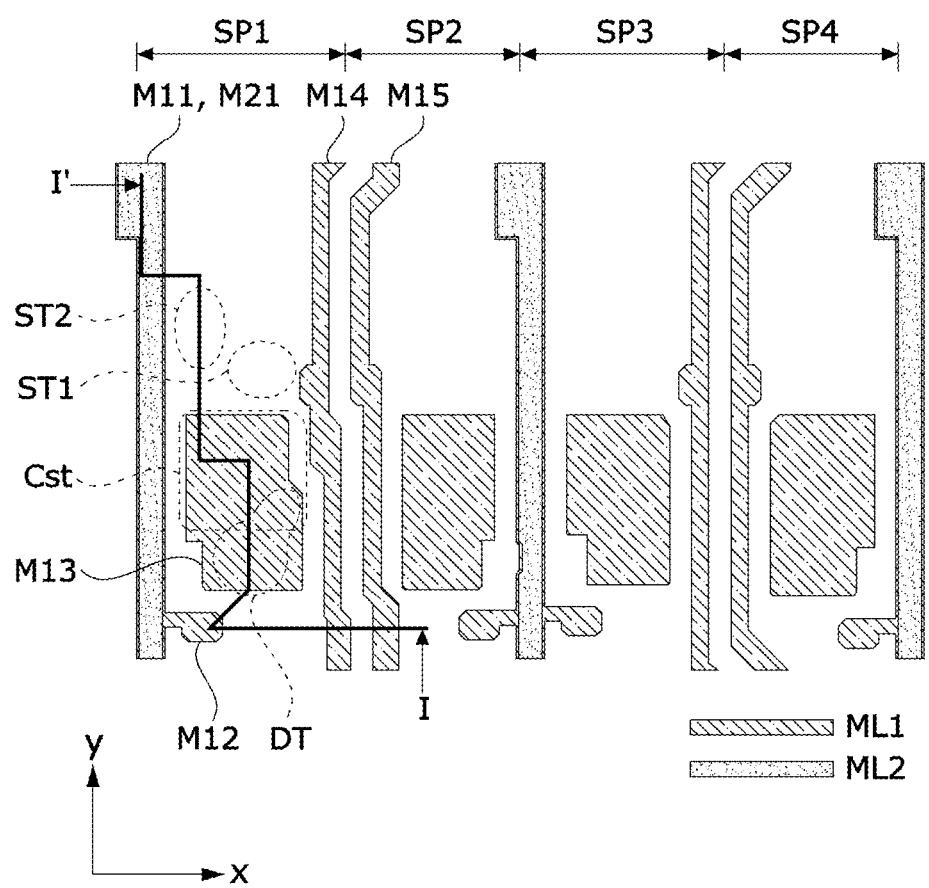
FIG. 8 is a plan view showing patterns of first and second metal layers in FIG. 6.
Figure 9:
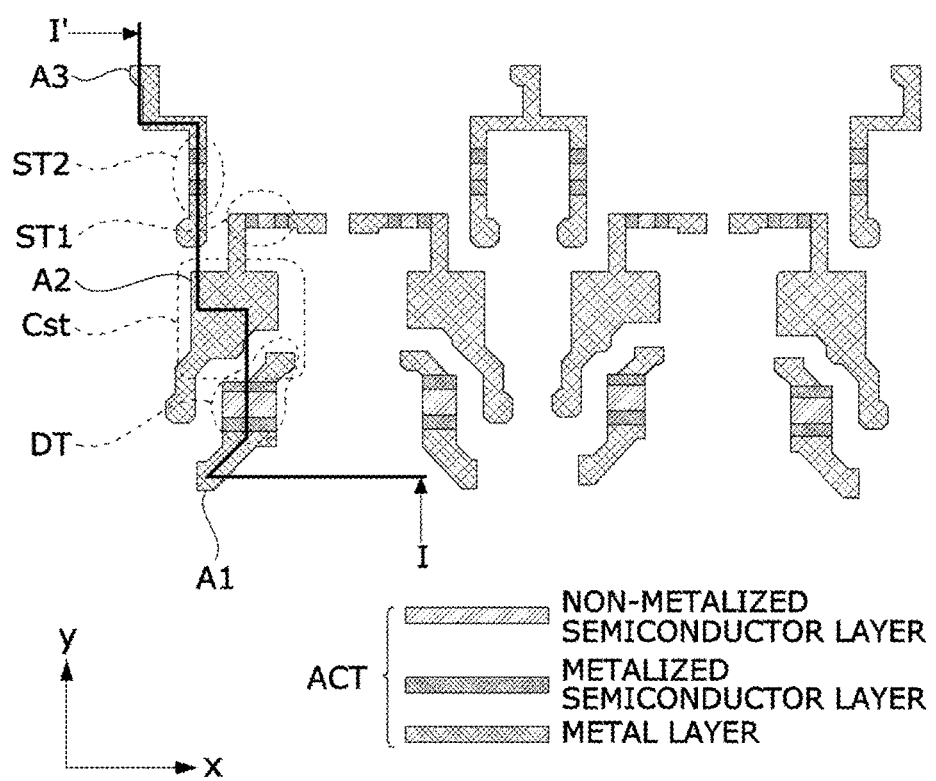
FIG. 9 is a plan view showing patterns of a semiconductor layer in FIG. 6.
Figure 10:
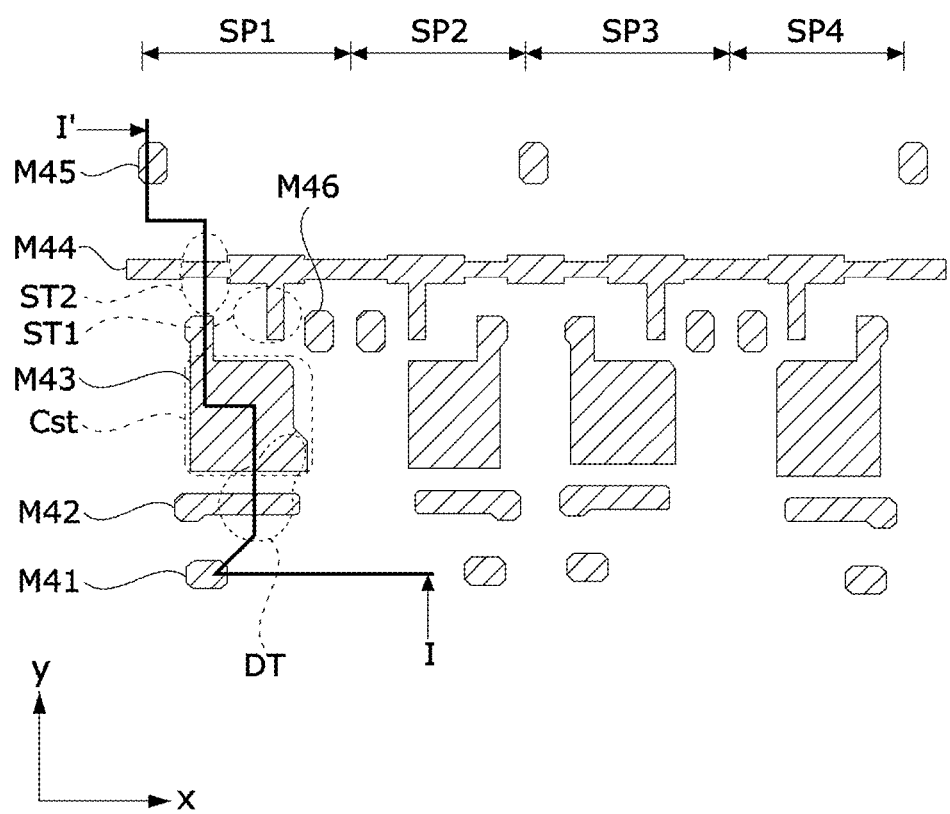
FIG. 10 is a plan view showing patterns of a third metal layer in FIG. 6.
Figure 11:
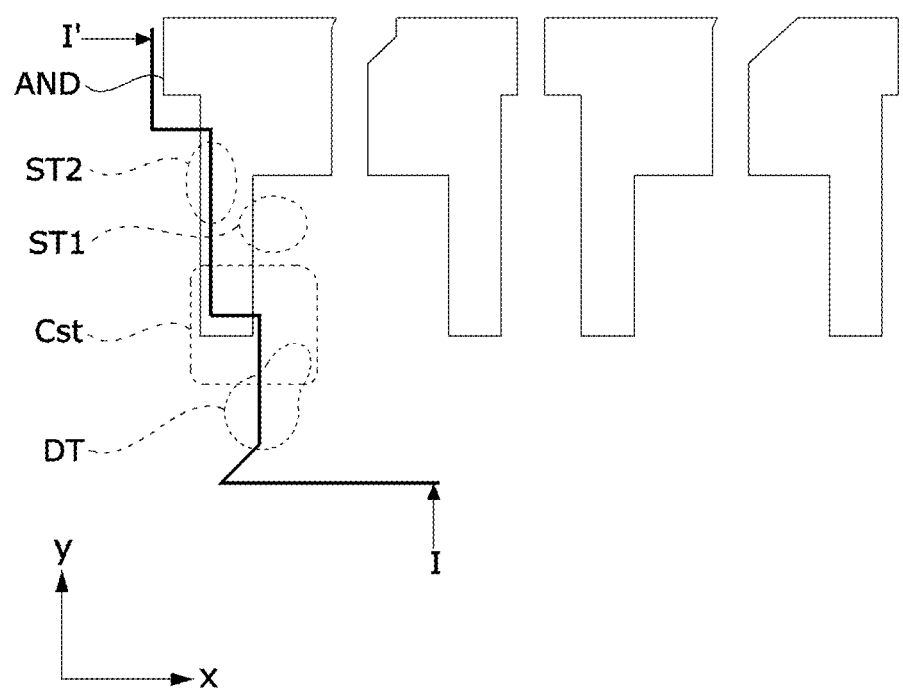
FIG. 11 is a plan view showing the anode electrode of a light emitting element in FIG. 6.

FIGS. 8 to 11 are diagrams showing in detail pattern shapes of main layers separated from the subpixels shown in FIG. 6. FIG. 8 is a plan view showing patterns of the first and second metal layers in FIG. 6. FIG. 9 is a plan view showing patterns of the semiconductor layer in FIG. 6. FIG. 10 is a plan view showing patterns of the third metal layer in FIG. 6. FIG. 11 is a plan view showing the anode electrode of a light emitting element in FIG. 6.

In a single photo process using a half-tone mask, the first and second metal layers are collectively patterned. In this photo process, the first buffer layer, the first metal layer, the second buffer layer, the second metal layer, and a photoresist layer are stacked on the substrate, the photoresist layer is exposed and developed, and then the first and second metal layers are collectively patterned through wet etching. The first and second metal layers under a thick photoresist layer remain on the substrate in a stacked structure, and the first metal layer under a relatively thin photoresist is etched and the second metal layer remains on the substrate. In the portion where no photoresist layer is present, both the first and second metal layers are etched and removed. As a result, patterns of the first and second metal layers as shown in FIG. 8 are formed on the substrate.

The first metal layer includes a VDD line pattern M11, a storage capacitor electrode pattern M13, and data line patterns M14 and M15. The VDD line pattern M11 includes a protrusion M12 that projects so as to overlap the first contact hole CH1. The storage capacitor electrode pattern M13 is a pattern in which the bottom electrode of the storage capacitor Cst and the light shield layer LS under the driving element DT are integrated. The storage capacitor electrode pattern M13 is electrically connected to the source electrode of the driving element DT through the third node Ns in FIG. 2. The protrusion M12 of the VDD line pattern M11 does not overlap the REF line RL made of the second metal layer, and it is exposed through the first contact hole CH1 and connected to the drain electrode of the driving element DT.

The second metal layer includes a REF line pattern M21. The REF line pattern M21 is formed along the VDD line pattern M11 on the VDD line pattern M11 and overlaps the VDD line pattern M11. The REF line pattern M21 does not overlap with the protrusion M12 of the VDD line pattern M11.

With reference to FIG. 9, semiconductor patterns A1, A2 and A3 include a metalized semiconductor pattern, a non-metalized pattern, and a semiconductor pattern covered by a metal layer. The metal layer can be omitted.

The first semiconductor pattern A1 includes the semiconductor channel of the driving element DT, a portion connected to the VDD line PL through the first contact hole CH1, and a portion connected to the storage capacitor Cst through the fifth contact hole CH5. The second semiconductor pattern A2 includes the semiconductor channel of the first switch element ST1, the intermediate electrode of the storage capacitor (Cst), and a portion connected to the gate electrode of the driving element DT through the fourth contact hole CH4.

The second semiconductor pattern A2 overlaps the light shield layer LS with the buffer layers BUF1 and BUF2 interposed therebetween, and overlaps the source electrode and the top electrode CE3 of the driving element DT with the gate insulating layer GI interposed therebetween. The second semiconductor pattern A2 overlaps the position of the third contact hole CH3.

The third semiconductor pattern A3 includes the semiconductor channel of the second switch element ST2, a portion connected to the REF line RL through the second contact hole CH2, and a portion connected to the storage capacitor Cst through the sixth contact hole CH6. The third semiconductor pattern A3 is electrically connected to the anode electrode AND through the top electrode pattern M43 of the storage capacitor Cst shown in FIG. 10.

With reference to FIG. 10, the third metal layer includes a VDD contact electrode pattern M41 connected to the VDD line P1 through the first contact hole CH1, a gate electrode pattern M42 of the driving element DT, a top electrode pattern M43 of the storage capacitor Cst, a gate line pattern M44, and a REF contact electrode pattern M45.

The VDD contact electrode pattern M41 is connected to the VDD line PL through the first contact hole CH1. The top electrode pattern M43 of the storage capacitor Cst is connected to the anode electrode AND through the third contact hole CH3, and is connected to the first semiconductor pattern A1 through the fifth contact hole CH5. The REF contact electrode pattern M45 is connected to the REF line RL through the second contact hole CH2.

The objects to be achieved by the present disclosure, the means for achieving the objects, and effects of the present disclosure described above do not specify essential features of the claims, and thus, the scope of the claims is not limited to the disclosure of the present disclosure.

It will be apparent to those skilled in the art that various modifications and variations can be made in the display panel and the display device using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display panel comprising:
a first metal layer disposed on a substrate;
a first insulating layer covering the first metal layer;
a second metal layer disposed on the first insulating layer;
a second insulating layer disposed on the first insulating layer to cover the second metal layer;
a semiconductor layer disposed on the second insulating layer;
a third insulating layer disposed on the second insulating layer to cover the semiconductor layer; and
a third metal layer disposed on the third insulating layer,
wherein the first metal layer comprises a light shield layer disposed under a transistor, a bottom electrode of a capacitor, a plurality of data lines to which a data voltage is applied, and a plurality of pixel driving voltage lines arranged parallel to the data lines and to which a pixel driving voltage is applied,
wherein the second metal layer comprises a plurality of reference voltage lines overlapping the pixel driving voltage lines with the first insulating layer interposed therebetween, and
wherein the third metal layer comprises a plurality of gate lines that cross the data lines, the pixel driving voltage lines, and the reference voltage lines and to which a gate signal is applied, and a gate electrode, a source electrode, and a drain electrode of the transistor.

2. The display panel of claim 1, wherein the third metal layer further comprises a first contact electrode connected to the pixel driving voltage lines, and a second contact electrode connected to the reference voltage lines.

3. The display panel of claim 2, further comprising:
a fourth insulating layer disposed on the second insulating layer to cover the third metal layer and the semiconductor layer;
a planarization layer disposed on the fourth insulating layer; and
an anode electrode of a light emitting element disposed on the planarization layer and connected to the transistor.

4. The display panel of claim 3, wherein:
the first contact electrode is connected to the pixel driving voltage line through a first contact hole penetrating the first and second insulating layers, and
the second contact electrode is connected to the reference voltage line through a second contact hole penetrating the first to third insulating layers; and
the anode electrode of the light emitting element is connected to the source electrode of the transistor through a third contact hole penetrating the fourth insulating layer and the planarization layer.

5. The display panel of claim 1, wherein:
the first insulating layer is interposed on the first metal layer overlapping the second metal layer; and
the second insulating layer is disposed on the first metal layer not overlapping the second metal layer.

6. The display panel of claim 5, wherein the first metal layer not overlapping the second metal layer includes the data lines.

7. The display panel of claim 1, wherein the third metal layer further comprises a top electrode of the capacitor.

8. The display panel of claim 1, wherein the semiconductor layer comprises a semiconductor channel of the transistor, and an intermediate electrode of the capacitor.

9. The display panel of claim 1, wherein a linewidth of the reference voltage lines is less than or equal to a linewidth of the pixel driving voltage lines.

10. The display panel of claim 1, wherein:
the first insulating layer is interposed on the first metal layer overlapping the second metal layer; and
the first and second insulating layers are stacked on the first metal layer not overlapping the second metal layer.

11. A display panel comprising:
a first data line connected to a first subpixel;
a second data line connected to a second subpixel neighboring the first subpixel;
a first pixel driving voltage line connected to the first subpixel to apply a pixel driving voltage to the first subpixel;
a second pixel driving voltage line connected to the second subpixel to apply the pixel driving voltage to the second subpixel;
a first reference voltage line overlapping the first pixel driving voltage line and connected to the first subpixel to apply a reference voltage lower than the pixel driving voltage to the first subpixel;

a second reference voltage line overlapping the second pixel driving voltage line and connected to the second subpixel to apply the reference voltage to the second subpixel; and a gate line connected to the first and second subpixels, wherein:

the first and second data lines are disposed between the first and second subpixels; and the first pixel driving voltage line and the first reference voltage line are spaced apart from the second pixel driving voltage line and the second reference voltage line with the first and second subpixels interposed therebetween.

12. The display panel of claim 11, further comprising:
a shorting bar to connect the first and second pixel driving voltage lines; and
a voltage lead-in portion to connect the first and second reference voltage lines.

13. The display panel of claim 12, wherein every N reference voltage lines among a plurality of reference voltage lines including the first and second reference voltage lines (N is a natural number between 2 and 10 inclusive) are connected to one voltage lead-in portion.

14. The display panel of claim 12, wherein the shorting bar and the voltage lead-in portion are disposed outside a pixel array in which a plurality of subpixels are arranged.

15. The display panel of claim 11, wherein a pair of power lines including the overlapping first pixel driving voltage line and first reference voltage line supply the pixel driving voltage and the reference voltage to two neighboring subpixels.

16. The display panel of claim 11, wherein each of the first and second subpixels comprises:
a light emitting element having an organic compound layer interposed between an anode electrode and a cathode electrode;
a driving element that includes a gate electrode connected to a first node, a drain electrode connected to a second node, and a source electrode connected to the anode electrode of the light emitting element through a third node;
a first switch element that includes a gate electrode connected to the gate line, a drain electrode connected to the data line, and a source electrode connected to the first node;
a second switch element that includes a gate electrode connected to the gate line, a drain electrode connected to the reference voltage line, and a source electrode connected to the third node; and
a capacitor connected between the first node and the third node.

17. A display device comprising:
a display panel that comprises a plurality of data lines, a plurality of pixel driving voltage lines arranged parallel to the data lines, a plurality of reference voltage lines overlapping the pixel driving voltage lines with an insulating layer interposed therebetween and arranged in parallel with the data lines, a plurality of gate lines crossing the data lines, the pixel driving voltage lines, and the reference voltage lines, and a plurality of subpixels;
a data driver configured to supply a data voltage of pixel data to the data lines;
a gate driver configured to supply a gate signal to the gate lines; and
a power supply configured to supply a pixel driving voltage to the pixel driving voltage lines, and supply a reference voltage lower than the pixel driving voltage to the reference voltage lines,
wherein:
the data lines include a first data line connected to a first subpixel, and a second data line connected to a second subpixel neighboring the first subpixel;
the pixel driving voltage lines include a first pixel driving voltage line connected to the first subpixel, and a second pixel driving voltage line connected to the second subpixel;
the reference voltage lines include a first reference voltage line overlapping the first pixel driving voltage line and connected to the first subpixel, and a second reference voltage line overlapping the second pixel driving voltage line and connected to the second subpixel;
the gate lines include a gate line connected to the first and second subpixels;
the first and second data lines are disposed between the first and second subpixels; and
the first pixel driving voltage line and the first reference voltage line are spaced apart from the second pixel driving voltage line and the second reference voltage line with the first and second subpixels interposed therebetween.

18. The display device of claim 17, further comprising:
a sensing unit connected to a pixel circuit of each of the subpixels through the reference voltage lines to sense driving characteristics of the pixel circuit in real time; and
a timing controller configured to modulate the pixel data based on sensing data received from the sensing unit and transmit it to the data driver, and control the data driver and the gate driver.

* * * * *